United States Patent
Allen, Jr. et al.

(10) Patent No.: US 6,427,095 B1
(45) Date of Patent: Jul. 30, 2002

(54) UNIVERSAL MULTI-TOOL ADAPTER FOR RECONFIGURING A WAFER PROCESSING LINE

(75) Inventors: Sam H. Allen, Jr., New Braunfels; Michael R. Conboy, Austin; Russel Shirley, Pflugerville, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/569,753

(22) Filed: May 12, 2000

(51) Int. Cl.[7] .............................. G06F 7/00; B65G 1/00; B65G 65/00
(52) U.S. Cl. ..................... 700/217; 414/271; 414/939
(58) Field of Search .................... 700/217; 414/217, 414/939, 271; 118/719

(56) References Cited

U.S. PATENT DOCUMENTS

| | | | | |
|---|---|---|---|---|
| 5,076,205 A | * | 12/1991 | Vowles et al. | 118/719 X |
| 5,695,564 A | * | 12/1997 | Imahashi | 118/719 X |
| 5,801,961 A | * | 9/1998 | Moore et al. | 700/217 X |
| 6,190,424 B1 | * | 2/2001 | Koike | 29/25.01 |

* cited by examiner

Primary Examiner—Christopher P. Ellis
Assistant Examiner—Gene O. Crawford

(57) ABSTRACT

Wafer processing time and handling is reduced by coupling a retrofitable processing tool between two standard processing tools. In an example embodiment, the retrofitable tool includes a metrology unit, which is coupled between two processing tools, that provides metrology capability without having to remove the wafers from the processing line. Once the metrology process is complete the wafers are transferred to the next processing tool and the retrofitable tool is decoupled from the two processing tools. An important advantage is the increased processing flexibility that the processing line reconfiguration method and the retrofitable tool bring to wafer processing.

17 Claims, 3 Drawing Sheets

UNIVERSAL MULTI-TOOL ADAPTER FOR RECONFIGURING A WAFER PROCESSING LINE

FIELD OF THE INVENTION

The present invention generally relates to wafer processing tooling on a wafer processing line in a semiconductor processing plant and, more particularly, to providing flexibility to wafer processing by reconfiguring portions of the line whenever necessary.

BACKGROUND OF THE INVENTION

A conventional semiconductor processing plant typically includes multiple processing areas or bays interconnected by a path, such as a conveyor belt. Each bay generally includes the requisite processing tools (interconnected by a subpath) to process semiconductor wafers for a particular purpose, such as photolithography, chemical-mechanical polishing or chemical vapor deposition, for example. Material stockers or stocking tools generally lie about the plant and store semiconductor wafers waiting to be processed. Each material stocker typically services two or more bays and can hold hundreds of cassettes. The wafers are usually stored in cassettes in groups of about 25 wafers. The wafers are then disposed within a carrier and move from one process to another in the carrier. The carriers are usually tracked by their carrier code by a computer system as they move through the plant.

Once a wafer lot has been retrieved, and the equipment has been set up, the operation on the wafers by a particular piece of equipment, or "tool," can begin. At this point, the lot is "moved-in" to the operation. An operator on the line then communicates this information to the host computer. The wafer lot remains in this state until the operation is completed. Once the operation is completed, the operator must perform tests and verifications on the wafers. When all tests and verifications have been performed, the host computer application program must be notified. Wafers may have moved from one cassette to another as a result of the operation; therefore the host application and computer have to be notified of these moves. The operator then places the cassette of "moved-out" wafers in the material stocker to await orders as to the location of the next piece of equipment that will perform operations on the wafers.

The semiconductor fabrication plant, including the bays, material stockers and the interconnecting path, typically operates under control of a distributed computer system running a factory management program. In this environment, the automated material handling system (AMHS) may conceptually include the cassettes, the transportation system (e.g., paths) and a control system (e.g., the distributed computer system). However, some of the key processes necessary to ensure that the line is operating properly, such as metrology, are usually located at a distance from where the wafers are currently being processed. It is necessary then to remove the wafers from the current processing tool and transport them back to the metrology area for measurements. This approach increases the number of times that the wafers are handled and increases cycle time in wafer processing.

SUMMARY OF THE INVENTION

The present invention is directed to addressing the above and other needs in connection with improving wafer processing tool flexibility and in reducing cycle time as wafers move through the semiconductor plant.

According to one aspect of the invention, it has been discovered that wafer processing lines are reconfigurable to accommodate changes in wafer processing recipes or to reduce wafer handling in a cluster tool of a wafer processing system. It has also been discovered that wafers are processed faster by moving the metrology and sorting processes/functions closer to the main wafer processing tools.

According to one aspect of the invention, a method of configuring wafer processing equipment in a semiconductor processing plant having a material handling system is described. A plurality of wafer processing tools is provided that are adapted to process at least one wafer presented by the material handling system. A retrofitable tool or multi-tool adapter is then provided that is adapted to be integrated with at least one of the plurality of processing tools. The retrofitable tool includes a wafer transfer unit disposed thereon to facilitate the transfer of at least one wafer between the processing tools and the retrofitable tool. The retrofitable tool is then coupled to at least one of the plurality of processing tools so as to reconfigure the wafer processing line as a function of a wafer processing recipe.

According to another aspect of the invention, a retrofitable tool for configuring wafer processing equipment in a semiconductor processing plant is disclosed. The retrofitable tool is adapted to operate in a semiconductor processing plant that includes a material handling system and at least one processing tool. The retrofitable tool is composed of an enclosure that includes a storage unit adapted to hold at least one wafer. A coupler arrangement is disposed on one side of the enclosure and is adapted to couple the retrofitable tool to at least one processing tool. An input port is disposed on the enclosure and a wafer transfer unit is coupled to the storage unit to facilitate the transfer of at least one wafer between the processing tool and the enclosure.

In yet another aspect of the invention, a system for configuring wafer processing equipment in a semiconductor processing plant includes a first processing tool and a second processing tool adapted to process at least one wafer. The system also includes a retrofitable tool adapted to be temporarily integrated with the first and second processing tool. A coupling arrangement is disposed on the retrofitable tool and on the processing tools to enable the retrofitable tool to be coupled with at least one of the first and second processing tools.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
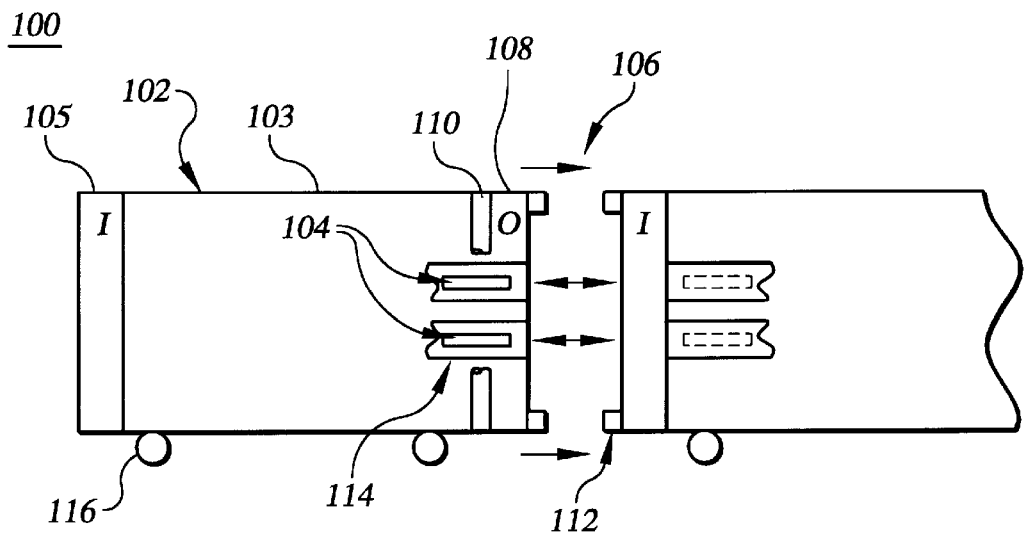
FIG. 1A is a retrofitable processing tool made in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a method and apparatus for reconfiguring cluster tools and wafer processing lines in a semiconductor plant. The invention is particularly suited for moving metrology equipment and wafer handling equipment in and out of the wafer processing line. While the present invention is not necessarily limited to a wafer processing application the invention will be better appreciated using a discussion of exemplary embodiments in such a specific context.

In an example embodiment, a retrofitable processing tool or a multi-tool adapter is used for reconfiguring a wafer processing line. The retrofitable tool allows processing equipment, metrology equipment, wafer sorters and stockers and the automated material handling system to be coupled together to facilitate the transfer of wafer lots from one processing tool to the next without operator intervention. The multi-tool adapter is programmed to understand a set of commands that include loading/unloading wafers, transferring wafers and purging oxygen from a processing chamber. The retrofitable tool is composed of an expandable enclosure that includes a storage unit adapted to hold various wafers. A coupling device, such as a pin and lock assembly, is disposed on one side of the storage area and is adapted to couple the multi-tool adapter to at least one processing tool. An input port is disposed on the enclosure and a wafer transfer unit is coupled to the storage unit to facilitate single wafer transfer between the processing tool and the enclosure.

Referring now to the figures, FIG. 1A illustrates a multi-tool adapter (or retrofitable tool) 100 for reconfiguring wafer processing equipment in a semiconductor processing plant. Multi-tool 100 is coupled to a first processing tool 101 and, in this example, includes a sealed link enclosure 102 that has a storage unit 103 adapted to hold a set of wafers 104. Tool 100 includes an input port 105 and a coupler arrangement 106 composed of an output port 108, a seal 110 and a pin and lock assembly 112. A wafer transfer unit 114 is coupled to the storage unit and facilitates the transfer of wafers 104 between processing tool 101 and enclosure 102. Tool adapter 100, in this example, includes a conveyor arrangement 116 coupled thereto for moving the tool adapter about the wafer processing area. The conveyor arrangement includes roller/wheel assemblies or an external forklift type device that carries the tool adapter to the processing tool to which it will be integrated.

Figure 1B:
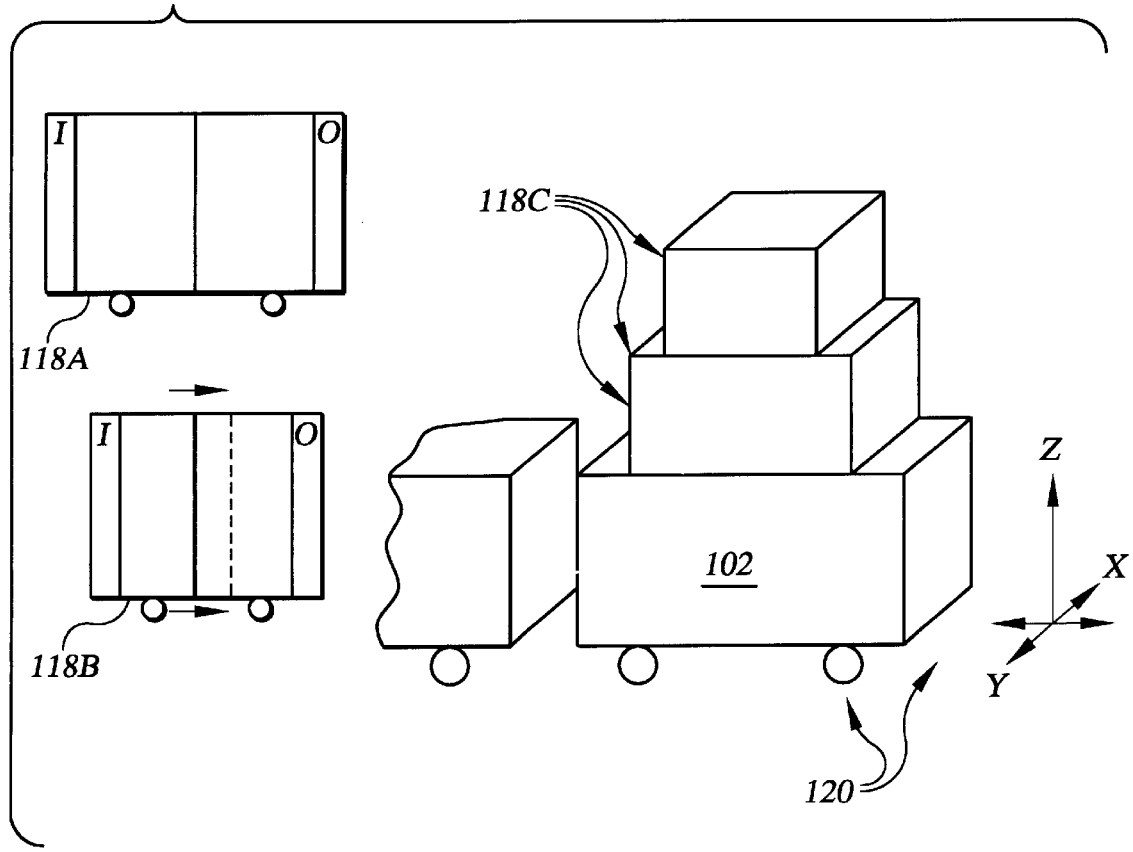
FIG. 1B is the retrofitable tool of FIG. 1A made in accordance with another embodiment of the invention.

In FIG. 1B, an example of tool adapter 100 illustrates the adaptability of size that the tool is expanded to, as in 118A, or reduced to, as in 118B, to accommodate the various sizes of processing tools that tool adapter 100 will adhere to. The walls of enclosure 102 are movable in horizontal direction to facilitate the size adjustment. In another example, tool adapter 100 is formed of concentric enclosures 102, as in 118C, to also accommodate processing tools of various sizes. Tool adapter 100 is illustrated to be movable in several directions (up to 360 degrees), as in 120 and the x-y-z axis shown, depending on the application. Multi-tool adapters include a metrology unit, a wafer coater, a stepper, a wafer stocker, a wafer sorter, a component integrity checker, a reticle sorter and an oxygen purging station or any other tool that performs a wafer processing/handling operation.

Figure 2A:
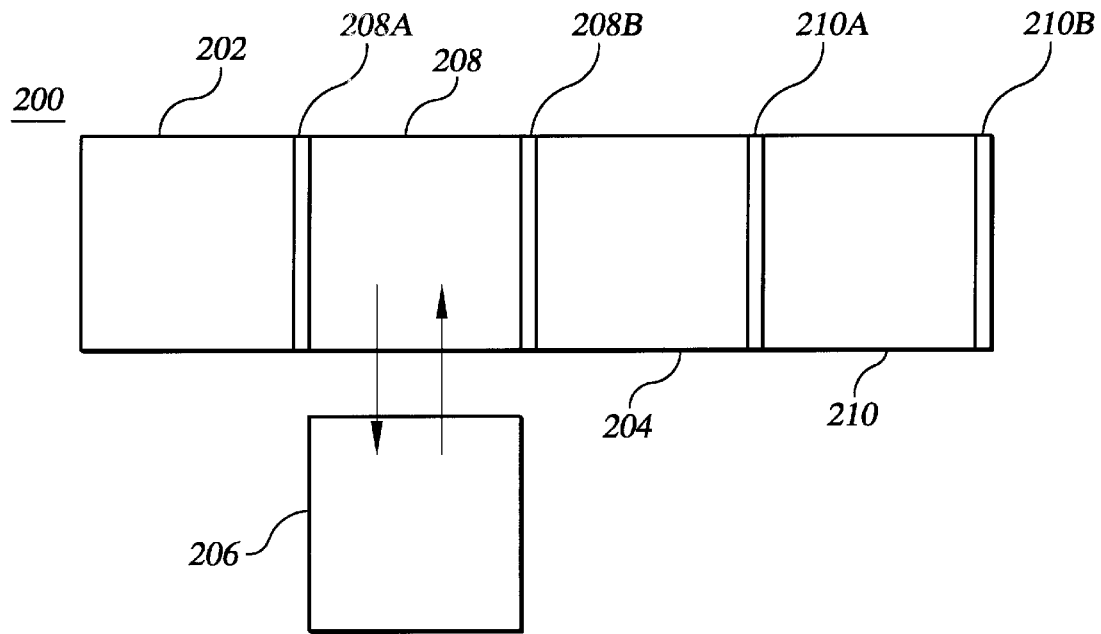
FIG. 2A illustrates a system for reconfiguring a wafer processing line in accordance with one embodiment of the invention.

Referring now to FIG. 2A, the top view of a reconfigurable wafer processing system 200 for use in a semiconductor processing plant includes a first processing tool 202, a second processing tool 204 and a third processing tool 206, all of which are adapted to process wafers. Multi-tool adapters 208 and 210 are also included in system 200 that are adapted to be temporarily integrated with processing tools 202, 204 and 206 to configure new processing schemes. In this example, multi-tool adapter 208 includes a coupler assembly 202A and 208B, disposed on either side of adapter 208, that enables tool 208 to be securely coupled between tools 202 and 204. Tool 206 is decoupled from tools 202 and 204 and moved laterally out (as indicated by the arrows) while adapter 208 is temporarily moved into position. In this example, system 200 has been reconfigured to include a metrology unit between tools 202 and 204 to conduct metrology measurements in situ without having to remove the wafers as they move from the process of tool 202 to the process of tool 204. Further, the wafer transfer units within adapter 208 facilitate wafer transfer between tools or chambers without the need for operator intervention or handling. This reduces the physical handling that can damage or contaminate the wafers. This approach also reduces cycle time in wafer processing in that the wafers need not be removed from one processing area and transported back and forth to another area of the plant for performing metrology measurements or to perform wafer sorting.

In this example, wafers are moved from tool 202 via the wafer transfer unit to adapter tool 208. Once the operation of adapter tool 208 is complete, the wafers are transferred to tool 204 for further processing. Adapter tool 208 is now removeable and tool 206 is moved back into the original position of system 200. In another embodiment, another adapter tool 210 is coupled to one end of system 200 as shown or is the metrology unit of tool 208 that is moved to the end of the process after tools 202, 204 and 206 are coupled together.

Figure 2B:
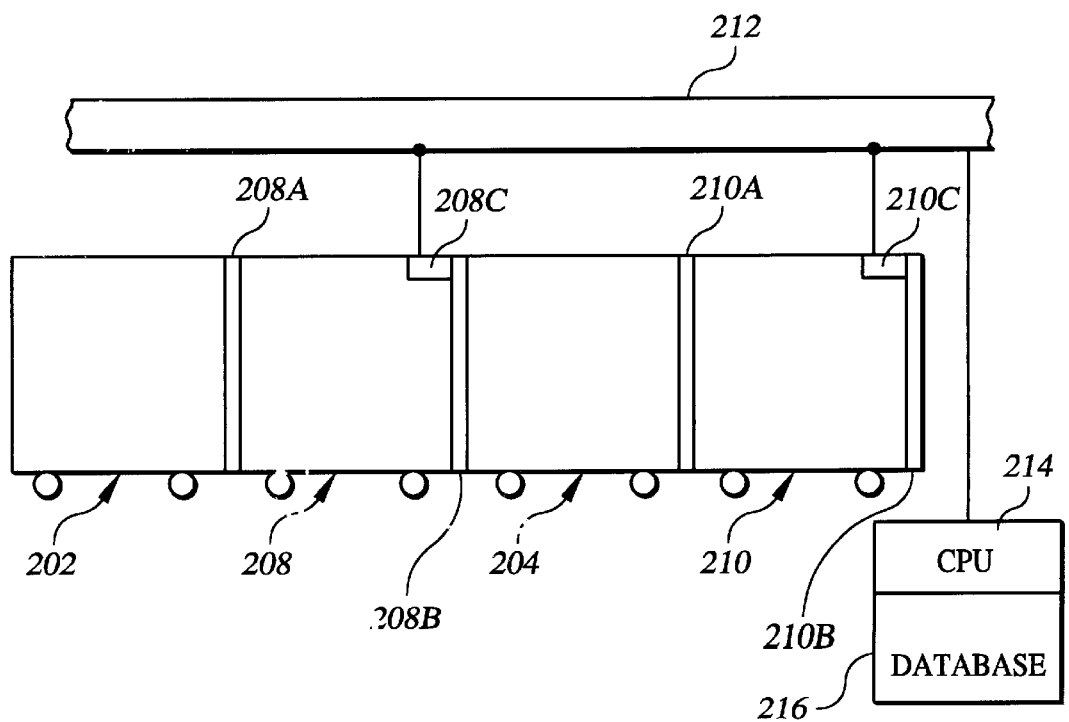
FIG. 2B illustrates a system for reconfiguring a wafer processing line that operates with a material handling system in accordance with another embodiment of the invention.

FIG. 2B exemplifies the side view of wafer processing system 200 operating with an automatic material handling system 212. In this example, tool adapters 208 and 210 include communications modules, 208C and 210C respectively, which communicate the location of the adapter tools in the wafer processing system to material handling system 212. Material handling system 212 is coupled to a computer arrangement 214 and to a database 216 for storing information on the location of the adapter tools in the wafer processing system.

Figure 3:
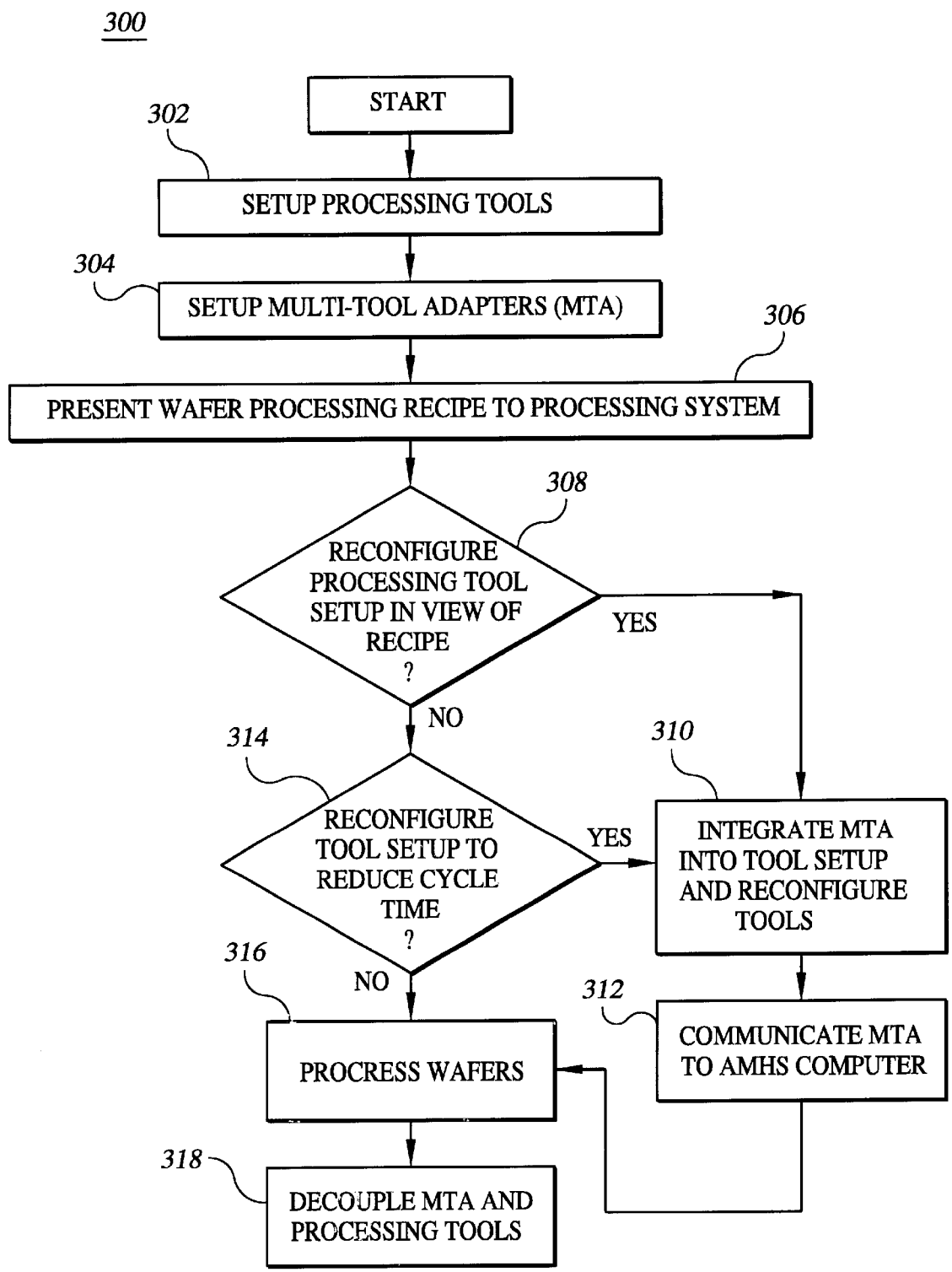
FIG. 3 is a process flow diagram of the manner in which the wafer processing line is reconfigured using the retrofitable tool in accordance with one embodiment of the invention.

Referring to FIG. 3, a flowchart 300 exemplifies how the wafer processing system 200 is reconfigured in accordance with an embodiment of the present invention. At block 302, the processing tools are setup for processing the wafers and at block 304 various multi-tool adapters (MTA) are provided. At block 306, a wafer processing recipe is provided. By way of example, a wafer moves through each processing tool of system 200 as dictated by the processing recipe. At 308, a determination is made whether to rearrange the processing tool setup in view of the recipe. If the answer is yes, the flow moves to block 310 where an adapter tool is intergrated into system 20 and the processing tools are reconfigured to follow the recipe. The wafer processing line and equipment are configurable into several combinations depending on the wafer processing recipe provided for the wafer lot to be processed. The location of the adapter tool and the reconfigured system is then communicated to the AMHS (Automated Material Handling System) computer's database at block 312.

If the determination at block 308 is made to not reconfigure the system due to the recipe, the flow moves to block 314 where a determination is made whether the cycle time of system 200 can be reduced by reconfiguring the system to include some of the adapter tools. Where cycle time reductions are possible, the flow moves to block 310 where an adapter tool is integrated into system 200 and the processing tools are reconfigured to follow a shortened processing path. For example, a metrology unit is coupled to system 200 rather than having to remove the wafers at system 200 and transporting them back and forth to the metrology area of the plant. The location of the adapter tool and the reconfigured system is then communicated to the plant. The location of the adapter tool and the reconfigured system is then communicated to the computer's database at block 312 for tracking purposes. After system 200 has been reconfigured, the wafers are processed at block 316. At block 318, the adapter tools are optionally decoupled if it is determined that a new processing recipe is to be used or reduced wafer handling is desired in the new processing tool configuration.

As noted above, the present invention is applicable to actively reconfiguring wafer processing systems of a wafer lot that is being processed. Accordingly, the present invention is not to be necessarily limited to the particular examples described above, but is intended to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of configuring a wafer processing line in a semiconductor processing plant, the method comprising:

providing a first processing tool and a second processing tool adapted to process at least one wafer;

providing a retrofitable tool adapted to be temporarily integrated with the first and second processing tool and programmed to transfer the at least one wafer between the processing tools without operator intervention;

coupling the retrofitable tool to at least one of the first and second processing tools, including configuring the first and the second processing tools with the retrofitable tool into different processing line combinations as a function of at least one wafer processing recipe; and after coupling the configurable tool, the retrofitable tool communicating its location within the material handling system to a material handling database.

2. The method of claim 1, after providing the retrofitable tool, further including providing a plurality of processing tools adapted to be configured with the retrofitable tool into different combinations as a function of the wafer processing recipe.

3. A method of configuring a wafer processing line in a semiconductor processing plant, the plant including a material handling system, the method comprising:

providing a plurality of processing tools adapted to process at least one wafer presented by the material handling system;

providing a retrofitable tool adapted to be integrated with at least one of the plurality of processing tools, the retrofitable tool programmed to have a wafer transfer unit disposed thereon transfer of at least one wafer between the processing tools and the retrofitable tool without operator intervention;

coupling the retrofitable tool to at least one of the plurality of processing tools so as to reconfigure the wafer processing line as a function of a wafer processing recipe, including reconfiguring the plurality of processing tools with the retrofitable tool into different processing line combinations as a function of different wafer processing recipes; and after the step of coupling the retrofitable tool, the retrofitable tool communicating its location within the material handling system to a material handling database.

4. A system for configuring a wafer processing line in a semiconductor processing plant, the system comprising:

a first processing tool and a second processing tool adapted to process at least one wafer;

at least one retrofitable tool adapted to be temporarily integrated with the first and the second processing tools and programmed to transfer the at least one wafer between the processing tools without operator intervention;

coupling means disposed on the at least one retrofitable tool and on the processing tools to enable the retrofitable tool to be coupled with at least one of the first and second processing tools; and means for configuring the first and the second processing tools with the retrofitable tool into different processing line combinations as a function of a wafer processing recipe.

5. The system of claim 4, wherein the retrofitable tool includes a wafer transfer unit disposed thereon that transfers the at least one wafer between the processing tools and the retrofitable tool.

6. The system of claim 4, wherein the system further includes a material handling system having a computer arrangement and a database coupled thereto.

7. The system of claim 4, wherein the retrofitable tool is selected from the group consisting of a material handler, a metrology unit, an integrity checker, a reticle sorter, a stocker and a sorter.

8. The system of claim 7, wherein the system includes a plurality of retrofitable tools that are adapted to be integrated with the processing tools in the semiconductor plant.

9. A system for configuring a wafer processing line in a semiconductor processing plant, the system comprising:

a material handling system having a computer arrangement and a database coupled thereto;

a first processing tool and a second processing tool adapted to process at least one wafer;

at least one retrofitable tool adapted to be temporarily integrated with the first and the second processing tools and programmed to transfer the at least one wafer between the processing tools without operator intervention and including means, responsive to the computer arrangement, for communicating to the database the location of said at least one retrofitable tool within the material handling system;

coupling means disposed on the at least one retrofitable tool and on the processing tools to enable the retrofitable tool to be coupled with at least one of the first and second processing tools.

10. A retrofitable tool for configuring a wafer processing line in a semiconductor processing plant, the plant including a material handling system and at least one processing tool, the retrofitable tool comprising:

an enclosure that includes a storage unit adapted to hold at least one wafer;

a coupler arrangement disposed on one side of the enclosure and adapted to couple the retrofitable tool to at least one processing tool;

a conveyor arrangement disposed on the enclosure and adapted to move the retrofitable tool to the processing tool;

an input port disposed on the enclosure;

a wafer transfer unit coupled to the storage unit and adapted to facilitate the transfer of at least one wafer between the processing tool and the enclosure; and a communication arrangement adapted to communicate the location of the retrofitable tool within the material handling system to a material handling database.

11. A system for configuring a wafer processing line in a semiconductor processing plant, the system comprising:

a first processing tool and a second processing tool adapted to process at least one wafer;

at least one retrofitable tool adapted to be temporarily integrated with the first and the second processing tools and programmed to transfer the at least one wafer between the processing tools without operator intervention, and including means, responsive to a computer arrangement, for communicating the location of the retrofitable tool within a material handling system;

coupling means disposed on the at least one retrofitable tool and on the processing tools to enable the retrofitable tool to be coupled with at least one of the first and second processing tools.

12. A retrofitable tool for configuring a wafer processing line in a semiconductor processing plant, the plant including a material handling system and at least one processing tool, the retrofitable tool comprising:

an enclosure that includes a storage unit adapted to hold at least one wafer;

a coupler arrangement disposed on one side of the enclosure and adapted to couple the retrofitable tool to at least one processing tool;

an input port disposed on the enclosure;

a wafer transfer unit coupled to the storage unit and adapted to facilitate the transfer of at least one wafer between the processing tool and the enclosure, wherein the retrofitable tool is adapted to be programmed to transfer the at least one wafer without operator intervention; and a communications arrangement adapted to communicate the location of the retrofitable tool within the material handling system to a material handling database.

13. The tool of claim 12, wherein the enclosure is constructed with concentric walls so as to be adaptable to processing tools of various sizes.

14. The tool of claim 12, wherein the coupler arrangement includes a pin and lock assembly that is adapted to couple the retrofitable tool to the processing tool.

15. The tool of claim 14, wherein the coupler arrangement includes an output port.

16. The tool of claim 12, wherein the tool is adapted to understand and automatically respond to a set of commands received in connection with processing of the at least one wafer.

17. The tool of claim 12, wherein the enclosure includes a set of sidewalls that are adapted to move in a horizontal directional to facilitate size adjustment.

* * * * *

UNITED STATES PATENT AND TRADEMARK OFFICE
CERTIFICATE OF CORRECTION

PATENT NO. : 6,427,095 B1
DATED : July 30, 2002
INVENTOR(S) : Allen, Jr. et al.

It is certified that error appears in the above-identified patent and that said Letters Patent is hereby corrected as shown below:

Column 3,
Lines 48 and 55, please delete "101".

Signed and Sealed this

Thirty-first Day of December, 2002

JAMES E. ROGAN
*Director of the United States Patent and Trademark Office*